United States Patent [19]

Grosholz

[11] 3,950,170

[45] Apr. 13, 1976

[54] METHOD OF PHOTOGRAPHIC TRANSFER USING PARTIAL EXPOSURES TO NEGATE MASK DEFECTS

[75] Inventor: Rainer Grosholz, Heilbronn-Bockingen, Germany

[73] Assignee: Licentia Patent-Verwaltungs-G.m.b.H., Frankfurt am Main, Germany

[22] Filed: Jan. 20, 1975

[21] Appl. No.: 542,277

Related U.S. Application Data

[63] Continuation of Ser. No. 303,822, Nov. 3, 1972, abandoned, which is a continuation of Ser. No. 94,561, Dec. 2, 1970, abandoned.

[30] Foreign Application Priority Data

Dec. 2, 1969 Germany............................ 1960463

[52] U.S. Cl................. 96/27 E; 96/27 R; 96/36.2; 96/44
[51] Int. Cl.² ....................... G03C 5/04; G03C 5/06
[58] Field of Search........ 96/27 R, 27 E, 36.2, 38.3, 96/35, 44

[56] References Cited
UNITED STATES PATENTS

| | | | |
|---|---|---|---|
| 716,939 | 10/1902 | Schmidt............................... | 96/45.2 |
| 2,343,586 | 3/1944 | Schufftan.............................. | 96/45 |
| 3,317,320 | 5/1967 | Reber .................................. | 96/36.2 |
| 3,476,561 | 11/1969 | Bertelsen et al...................... | 96/36.2 |
| 3,518,084 | 6/1970 | Barson et al......................... | 96/36.2 |
| 3,536,407 | 10/1970 | Sandlin ............................... | 96/27 R |
| 3,598,604 | 8/1971 | De Puy .................................... | 96/44 |
| 3,615,466 | 10/1971 | Sahni..................................... | 96/44 |
| 3,647,445 | 3/1972 | Burns..................................... | 96/35 |
| 3,823,016 | 7/1974 | Di Fazio et al. .................... | 96/27 R |
| 3,843,362 | 10/1974 | Di Fazio et al. .................... | 96/27 R |

*Primary Examiner*—Edward C. Kimlin
*Attorney, Agent, or Firm*—Spencer & Kaye

[57] ABSTRACT

A method of photographic transfer of an original pattern onto a substrate having a photo-sensitive coating comprises carrying out repeated partial exposures which together make up a complete exposure, with the pattern being renewed after each partial exposure. Such renewing includes either relative movement between pattern and substrate or exchange of pattern members having the same pattern.

12 Claims, 3 Drawing Figures

METHOD OF PHOTOGRAPHIC TRANSFER USING PARTIAL EXPOSURES TO NEGATE MASK DEFECTS

CROSS REFERENCE TO RELATED APPLICATION

This application is a continuation of copending application Ser. No. 303,822, filed Nov. 3, 1972, now abandoned, which itself is a continuation of application Ser. No. 94,561, filed Dec. 2, 1970, now abandoned.

BACKGROUND OF THE INVENTION

The invention relates to a method for photographic transfer of an original pattern to a substrate coated with a photo-sensitive coating.

SUMMARY OF THE INVENTION

It is the object of the present invention to eliminate or reduce faults in the original pattern during the transfer of the structures arranged on the original to a substrate of any desired kind.

According to the invention, there is provided a method of photographic transfer of an original pattern to a substrate with a photo-sensitive coating comprising the steps of exposing the coating to said original pattern for 1/n-th of the time necessary for full exposure, where n is at least equal to three, renewing said original pattern, and, in sequence, repeating the step of exposing the coating and repeating the step of renewing until full exposure is achieved.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Figure 1:
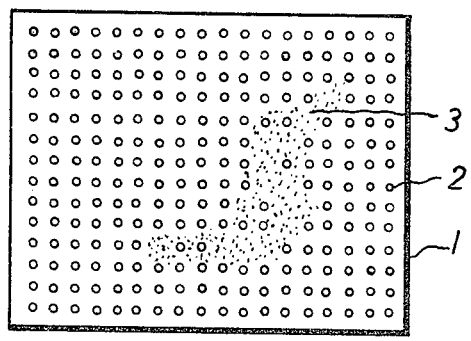
FIG. 1 shows one form of working mask having an error in the original pattern.

Basically, in the photographic transfer of an original pattern to a substrate coated with a photo-sensitive coating, the invention proposes that the total exposure time necessary for the transfer is divided into a plurality of successive component exposure phases, and, if the pattern present on the original is composed of a plurality of like individual structures arranged in a regular, repeating graticule distribution, the original is displaced by at least one regular graticule division in relation to the substrate before each component exposure phase, or the original is exchanged for a similar original before each component exposure phase.

Provision is preferably made for the original to be displaced by an integral multiple of the regular graticule division in relation to the substrate before each component exposure phase. The present invention is based on the fact that, in the production of originals, for example of photo-masks, which are needed for the production of semiconductor devices or printed circuits, various statistical or systematic errors occur which prevent satisfactory transfer of the original structure to the substrate. Photo-masks for semiconductor devices are generally produced by means of the known "step-and-repeat" method, wherein the starting point is an individual structure, and this structure is repeatedly reproduced on a film, and the individual structure or the film is displaced by a prescribed regular graticule measurement of the whole mask, before each reproduction process. Already during the production of this mask, faults may be caused by particles of dust or holes in the photographic emulsion, and may lead to rejects, which increase the costs, during the production of the semiconductor devices. Further sources of error result from the wear of the working masks, their soiling in the course of numerous operational processes, or during the duplication of an original mask. Further rejects may occur during the transfer of the mask pattern to the semiconductor surface coated with photolacquer, as a result of faults in the optical system used for the reproduction or as a result of dust in the path of light.

The sources of error indicated can be eliminated completely by means of the method according to the invention.

The method according to the invention is based on the principle that all photolacquers integrate the incident light. The exposure is only complete if the whole quantity of light is introduced in a single exposure step, or the $x$th part of the total amount of light necessary is introduced in $x$ partial exposure phases. It must be bourne in mind that the total exposure time depends on various factors. These include, for example, the nature of the photolacquer and its thickness, the light spectrum, and the size of the structures to be transferred. Thus, with a specific photolacquer for example, the total exposure time may vary by ± 1 minute, if a variation in the size of the transferred structures of ± 20% is accepted.

Now if, in accordance with the invention, the photolacquer is exposed with a fixed relative position of the mask in relation to the substrate, for only a fraction of the total exposure duration, and then the mask is displaced in relation to the substrate by an integral multiple of the regular graticule divisions, then any fault which is present appears at a different place before the next partial exposure. If the total exposure duration is divided into $x$ partial exposure phases, however, although the fault appears in $x$ positions, it is only transferred there by the $x$th part of the total amount of light and therefore does not become apparent. In this manner, the fault is completely eliminated.

It can be shown theoretically that the total exposure time must be divided into more than two partial exposure phases. Three to five partial exposure phases have proved economical in experiments and, in the majority of cases, sufficient to eliminate the faults. Considerably more partial exposure steps may, however, naturally be selected if the resulting additional expenditure is justified by the improved result.

The invention will be explained in more detail below with reference to an example of an embodiment.

Figure 2:
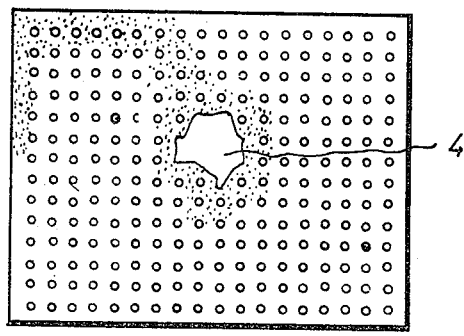
FIG. 2 shows the same form of working mask having a different error in the original pattern.
Figure 3:
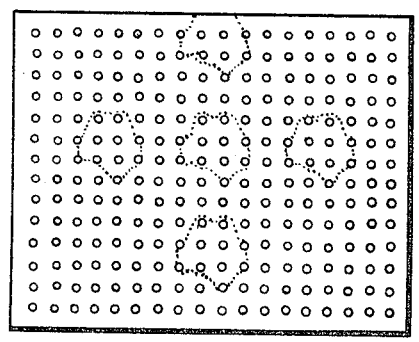
FIG. 3 shows the result of full exposure of the working mask of FIG. 2 by the method according to the invention.

The working mask 1 may be a negative mask, as illustrated in FIGS. 1 and 2, such as is needed for example for the production of a plurality of like diodes. The structures 2 appear transparent with a layer which is otherwise impermeable to light. In FIG. 1, a structure is illustrated wherein structures are completely obliterated by faults present in the region 3. Another kind of fault is illustrated in FIG. 2. Here an unwanted giant structure is reproduced through a faulty area 4 and exposure with only a single exposure phase would lead to the production of a giant diode. FIG. 3 indicates in broken lines that, on displacement of the mask, the fault always appears at a different place and so is only reproduced with the xth part of the amount of light in relation to one place. FIG. 3 likewise shows the result of the exposure after the total exposure time has been divided into five partial exposure phases of equal length. Before each partial exposure step, the mask has been displaced relatively by an integral multiple of the regular repeating graticule division. As FIG. 3 shows, a faulty area is no longer distinguishable in the structure reproduced. All the diode structures are reproduced true to the original.

Experiments have also shown that even a three-part exposure time may be sufficient. If there are bright additional structures in the mask, one third of the exposure is effected through the faults and two thirds through two undamaged structures. It is true that the exposure may still be too great at the points at which the fault is present; but the fault is eliminated. With dark faults, that is to say with structures absent at certain places, the amount of light introduced in specific regions only amounts to two-thirds of the total amount of exposure. But since full development begins already with half the amount of light, the structures nevertheless appear in the developed photolacquer layer, even through somewhat too small in size.

In general it may be said that as the number of displacement and partial exposure steps increases, the probability of eliminating the faults and of adhering to the dimensions of the structures reproduced is increased.

With the division of the total exposure time into five partial exposure phases outlined in the example, the total exposure duration was between four and five minutes. A semiconductor wafer which is covered with a layer of oxide or nitride at the surface adapted for the transfer of the pattern, and which in turn is coated with a photolacquer layer, served as a substrate. The developed photolacquer layer may serve, for example, as an etching mask for the subjacent oxide or nitride layer which in turn may be used as a diffusion mask for example, after this etching process.

The method according to the invention has the advantage, apart from the advantages already outlined, that the blurred edges present with a single exposure step are eliminated. Graticule errors are likewise compensated by the method described. Fault-free mask copies and metal-glass masks can also be produced by means of a method according to the invention. For the metal-glass mask, a glass disc is used as a substrate and is covered with a metal layer at its surface. During the production of mask copies, the substrate consists of a suitable material, for example of film material.

In order to carry out the method described, devices are preferably used which comprise two cross-tables. The one cross-table serves, as usual, to center mask and wafer, the relative displacement of the mask in relation to the wafer is then carried out by means of the other cross-table.

Instead of the relative displacement of the mask in relation to the semiconductor wafer as described, there is also the possibility of exchanging the mask for a similar mask in the same adjusted position as its predecessor, before each partial exposure step. In this case, for example, five similar mask would be produced and, for example, be accommodated in a magazine, and be arranged in succession, in an adjusted position in relation to the substrate, between the exposure phases.

Mask errors can be eliminated in this manner because it can be assumed that faults would appear at different points in five masks which were produced in independent processes. In addition, if the mask is changed before each partial exposure phase, masks can be used which only contain a specific pattern once. This applies, in particular, to printed circuits. On the other hand, faults in the image-forming lens cannot be avoided by exchanging the mask.

The method according to the invention is suitable for the production of semiconductor devices of all kinds, particularly diodes, transistors and integrated switching circuits which are produced by means of the planar technique. In addition, printed circuits can be produced by the method described if a metallically coated board of insulating material is used as a substrate.

It will be understood that the above description of the present invention is susceptible to various modifications, changes and adaptations.

What is claimed is:

1. A method of photographic transfer of the image of a structure forming part of an original pattern to a substrate coated with a photosensitive coating comprising the steps of exposing said coating to said structure of said original pattern for 1/n-th of the time necessary for full exposure, where n is at least equal to three, where one-half of a full exposure is sufficient to cause development of the coating to begin and a representation of the pattern to become apparent on the coating and an exposure for 1/n-th of the full exposure time is insufficient to cause a representation of the pattern to become apparent on the coating, replacing said structure with another and identical structure, and, in sequence, repeating the step of exposing said coating and repeating the step of replacing until full exposure is achieved.

2. A method as defined in claim 1 wherein said original pattern has the form of a plurality of like individual structures arranged in regular, repeating graticule distribution and said step of replacing comprises causing relative displacement of said original pattern and said substrate by at least one regular graticule division.

3. A method as defined in claim 2 wherein said original pattern is displaced by an integral multiple of the regular graticule division in relation to said substrate.

4. A method as defined in claim 1 wherein said step of replacing comprises exchanging members each carrying the same original pattern.

5. A method as defined in claim 1 wherein said time for full exposure is divided into between three and five portions of equal length.

6. A method as defined in claim 1 wherein said original pattern comprises a photomask and said substrate is a semiconductor body.

7. A method as defined in claim 6 wherein said semiconductor body is coated with an oxide or nitride layer at the surface on which the pattern is to be received and said layer is coated with a layer of photolacquer.

8. A method as defined in claim 1 wherein said original pattern comprises a photomask and said substrate comprises a metallically coated board of insulating material suitable for a printed circuit.

9. A method as defined in claim 1 wherein said original pattern comprises a photomask and said substrate is a material suitable for producing a copy of the photomask.

10. A method as defined in claim 1 wherein said substrate comprises a glass plate with a metal layer on the surface thereof.

11. A method of photographic transfer of the image of a structure forming part of an original pattern to a substrate coated with a photosensitive coating, said original pattern being in the form of a plurality of like individual structures arranged in regular, repeating graticule distribution, said method comprising the steps of exposing said coating to said original pattern for 1/n-th of the time necessary for full exposure, where $n$ is at least equal to three, where one-half of a full exposure is sufficient to cause a representation of the pattern to become apparent on the coatings and an exposure for 1/n-th of the full exposure time is insufficient to cause a representation of the pattern to become apparent on the coating, relatively displacing said original pattern and said substrate by at least one regular graticule division and, in sequence, repeating the step of exposing said coating and repeating the step of relative displacement until full exposure is achieved.

12. A method of photographic transfer of the image of a structure forming part of an original pattern to a substrate coated with a photosensitive coating comprising the steps of exposing said coating to said original pattern for 1/n-th of the time necessary to achieve full exposure, where n is at least equal to three, where one-half of a full exposure is sufficient to cause a representation of the pattern to become apparent on the coating and an exposure for 1/n-th of the full exposure time is insufficient to cause a representation of the pattern to become apparent on the coating, exchanging a member carrying said original pattern for a member carrying the same pattern, and, in sequence, repeating the step of exposing said coating and repeating the step of exchanging until full exposure is achieved.

* * * * *